United States Patent [19]
Sato et al.

[11] Patent Number: 5,362,981
[45] Date of Patent: Nov. 8, 1994

[54] INTEGRATED SEMICONDUCTOR DEVICE HAVING A BURIED SEMICONDUCTOR LAYER AND FABRICATION METHOD THEREOF

[75] Inventors: Noriaki Sato; Fumitake Mieno, both of Kawasaki, Japan

[73] Assignee: Fujitsu Limited, Kawasaki, Japan

[21] Appl. No.: 699

[22] Filed: Jan. 5, 1993

[30] Foreign Application Priority Data

Jan. 7, 1992 [JP] Japan .................... 4-000548

[51] Int. Cl.$^5$ ............... H01L 27/02; H01L 27/04; H01L 27/12
[52] U.S. Cl. .................... 257/371; 257/369; 257/372; 257/374; 257/402; 257/655
[58] Field of Search ............... 257/368, 369, 371, 372, 257/374, 402, 655

[56] References Cited

U.S. PATENT DOCUMENTS 5,023,190 6/1991 Lee et al. ........................ 257/369
5,172,203 12/1992 Hayashi .......................... 257/369

FOREIGN PATENT DOCUMENTS 57-56961 4/1982 Japan ............................ 257/371

*Primary Examiner*—Ngan V. Ngo
*Attorney, Agent, or Firm*—Staas & Halsey

[57] ABSTRACT

A structure and its fabrication method of an integrated semiconductor device including circuit elements such as MOSFETs. A well is formed in the semiconductor substrate within windows of a field oxide layer. A lightly-doped semiconductor layer is selectively formed on the exposed surface of the well. A channel region and a pair of source and drain regions of a MOSFET are formed in the lightly-doped semiconductor layer. The highly-doped buried semiconductor layer of the same conductivity type as that of the lightly-doped semiconductor layer is formed under the channel region in the lightly-doped semiconductor layer. The structural features and fabrication method provides a great degree of freedom in designing a MOSFET having a further shorter-channel length without deteriorating its drivability and punch-through breakdown voltage.

15 Claims, 10 Drawing Sheets

INTEGRATED SEMICONDUCTOR DEVICE HAVING A BURIED SEMICONDUCTOR LAYER AND FABRICATION METHOD THEREOF

BACKGROUND OF THE INVENTION

Field of the Invention

The present invention relates to a semiconductor integrated device having insulated gate field effect transistors which are well known in general as MOSICs, and a fabrication method thereof, and in particular, to a short channel MOSIC for high-speed operation and with high reliability.

Description of the Prior Art

In a semiconductor integrated circuit, the lower supply voltage of MOSFETs is a constant technical requirement associated with miniaturizing the transistor size. For instance, the supply voltage decreases successively from 5.0 v to 4.0 v, and from 4.0 v to 3.3 v as the gate length decreases from 1 $\mu$m to 0.8 $\mu$m, and from 0.8 $\mu$m to 0.5 $\mu$m, respectively. This may be explained by the fact that scaling-down of the gate length, without decreasing the supply voltage, would lead to an increase of an internal electric field of MOSFETs, which results in degradation of the device characteristics by unfavorable phenomena such as the punch-through breakdown, drain-induced-barrier-lowering (DIBL), and hot-carrier effect.

These phenomena can be indeed avoided by lowering a drain voltage with a decreased supply voltage, but an effective gate voltage (V g - V th) also decreases inevitably, which eventually lowers the saturated drain current to degrade driving ability of MOSFETs, because the threshold voltage (V th) is still kept constant without any lowering under an operating condition of the saturated region.

For the above reason, a technique has been desired that can lower the threshold voltage (V th) by decreasing an impurity concentration in a channel region while keeping a necessary punch-through breakdown voltage under an operating condition of a supply voltage, particularly below 3.3 v. To accomplish this purpose, several efforts have been made, such as a low-impurity channel MOS transistor disclosed by M. AOKI in Tech. Digest Paper of IEEE IEDM, 939–941 (1990), and also a short-channel MOSFET with a buried doped layer disclosed by E. TAKEDA at The Spring meeting of the Japan Society of Applied Physics 28P-T-2, 1991. Although these efforts have achieved only a limited success for either a short-channel effect or punch-through breakdown, both efforts have substantial disadvantages in controlling process conditions which may result in poor reliability in device characteristics.

SUMMARY OF THE INVENTION

It is a primary object of the present invention to provide a reliable structure and a manufacturing method for high-density semiconductor integrated circuits comprising a plurality of active elements.

It is another object of the present invention to provide integrated MOSFETs having a short channel length with a high punch-through breakdown voltage and high drivability.

These objects are achieved by adopting the following device structure and fabricating method:

an integrated semiconductor device according to the present invention comprises:

a semiconductor substrate having a surface and a surface portion bordering the surface, the surface portion having a first conductivity type;

an insulating layer formed on the semiconductor substrate, the insulating layer having a plurality of windows, each window exposing a part of the surface of the surface portion;

a semiconductor layer formed on selected ones of the exposed parts of the surface of the surface portion, the semiconductor layer further comprising:

a buried semiconductor layer of the first conductivity type having an upper surface in the semiconductor layer, the buried semiconductor layer having an impurity concentration higher than an impurity concentration of the semiconductor layer;

a first region of the first conductivity type formed in the semiconductor layer adjacent to a surface thereof and above the buried semiconductor layer, the first region of the first conductivity type having an impurity concentration lower than the impurity concentration of the buried semiconductor layer;

a pair of second regions of a second conductivity type opposite to the first conductivity type formed in the semiconductor layer adjacent to the surface thereof, each one of the pair of the second regions separated from the other one of the pair of the second regions by the first region of the first conductivity type; and a plurality of active elements formed in the semiconductor layer within selected ones of the windows, each of the active elements further comprising:

the first region of the first conductivity type, and the pair of the second regions of the second conductivity type.

A fabricating method of the integrated semiconductor device according to the present invention comprises the steps of:

(a) forming a plurality of surface portions of a first conductivity type within a semiconductor substrate adjacent to a surface of the semiconductor substrate;

(b) forming an insulating layer on the semiconductor substrate with a plurality of windows exposing the surface of the surface portions;

(c) forming a semiconductor layer of the first conductivity type within selected ones of the windows, so that the semiconductor layer has an impurity concentration lower than an impurity of the surface portions of the semiconductor substrate;

(d) forming a buried semiconductor layer of the first conductivity type having an upper surface in the semiconductor layer, the buried semiconductor layer having an impurity concentration higher than the impurity concentration of the semiconductor layer; and (e) forming a first region of the first conductivity type and a pair of second regions of a second conductivity type opposite to the first conductivity type adjacent to the surface of the semiconductor layer, each one of the pair of the second regions separated from the other one of the pair of the second regions by the first region of the first conductivity type.

The above mentioned device structure and its fabrication method may provide a great degree of freedom to design device structures, by which designers can determine an impurity concentration in each of various semiconductor regions independently without much restriction by the impurity concentration of neighboring regions. This advantage is most high-lighted in a complementary MOS integrated circuit (or CMOSIC) described in detail later.

DESCRIPTION OF THE PREFERRED EMBODIMENTS

Figure 1A:
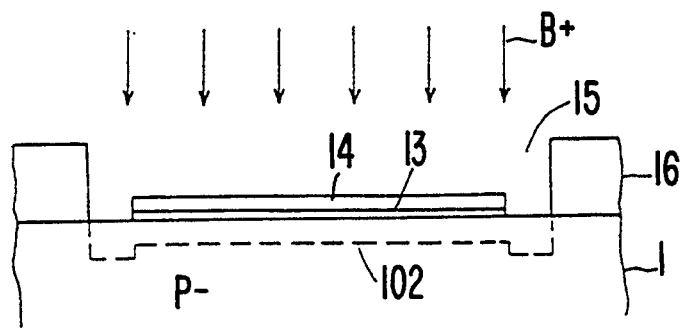
FIGS. 1(a) through 1(d) are cross-sectional views of a portion of the integrated semiconductor device in various steps (first part) of the manufacturing process related to the first embodiment of the present invention.
Figure 1B:
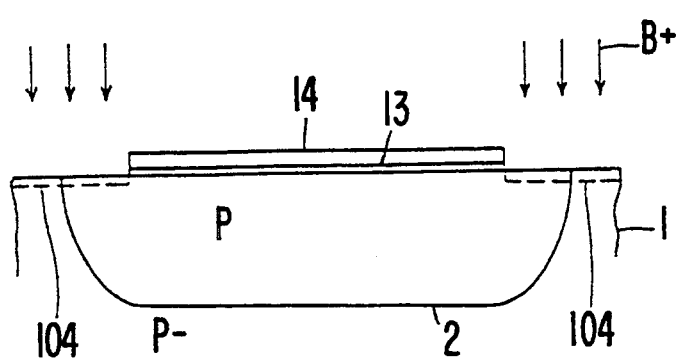

Referring to FIGS. 1(a) through 1(d), a silicon nitride film 14 with an underlaid thermal silicon dioxide film 13 is formed selectively on the top surface of a p type silicon substrate 1 having a resistivity of about 10 Ω cm, which defines each device area. To form wells, boron ions (B+) are implanted at an energy of about 180 kev and a dose of about $1 \times 10^{13}$ ions cm$^{-2}$ through a photoresist window 15 patterned on a surface of the silicon substrate 1 having the nitride and dioxide film on it. An implanted region is shown by a dotted line 102 in FIG. 1(a).

After stripping the photoresist 16, the implanted species is driven in with an approximately 180-minute heat treatment at about 1200° C., which gives a p-well 2 having an approximately 2- μm junction depth and a surface impurity concentration of about $10^{17}$ atoms cm$^{-3}$. Another boron ion (B+) implant is carried out at about 50 kev and a dose of about $2 \times 10^{13}$ ions cm$^{-2}$ over an entire surface of the silicon substrate 1 with the silicon nitride film 14 serving as a mask. An implanted region is shown by a dotted line 104 in FIG. 1(b).

Figure 1C:
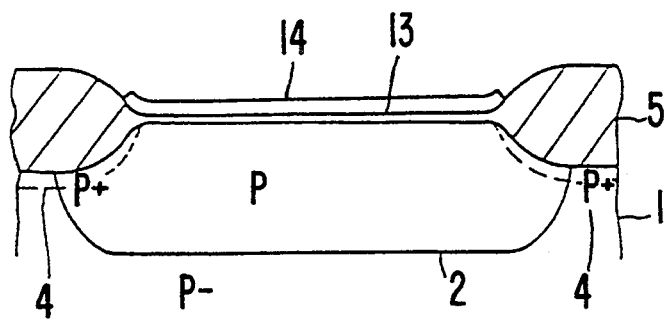

A field oxide layer 5 having a thickness of about 400 nm is formed on the surface of the silicon substrate, except the portion of the surface covered by the silicon nitride film, by selective oxidation of about 900° C. in the chlorine-contained oxidizing atmosphere which also activates and drives in the implanted boron ions to produce a p-type channel stop 4 beneath the field oxide layer 5, as shown in FIG. 1(c).

Figure 1D:
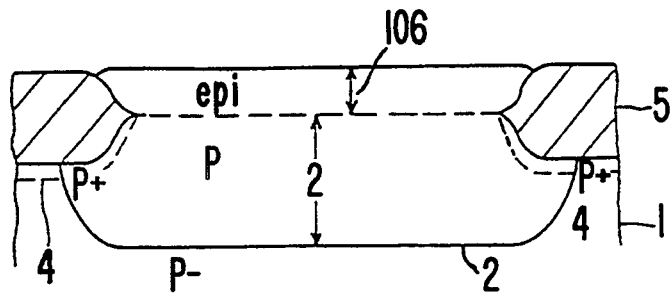

After removing the nitride and dioxide mask by conventional processes, an undoped epitaxial layer 106 having a thickness of about 150 nm is formed selectively on the exposed area of the surface of the well 2 by a low-temperature selective epitaxial technique, such as using a gas mixture of monosilene (SiH$_4$), hydrogen (H$_2$), and chlorine (Cl$_2$) at about 600° C. with a pressure of about 1 Torr, as shown in FIG. 1(d).

Figure 2A:
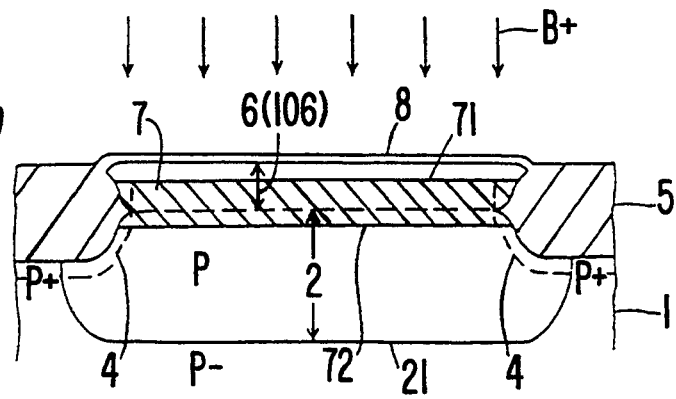
FIGS. 2(a) through 2(c) are cross-sectional views of a portion of the integrated semiconductor device in various steps (second part) of the manufacturing process related to the first embodiment of the present invention.
Figure 2B:
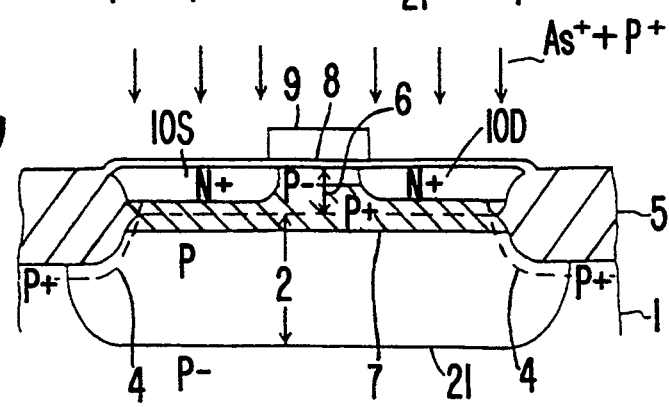
Figure 2C:
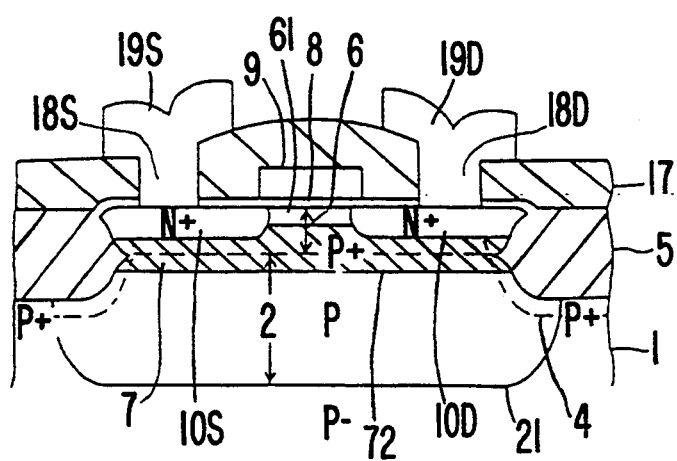

Referring to FIGS. 2(a) through 2(c), after removing a sacrificial oxide film having a thickness of about 10 nm (not shown) which is formed on the top surface of the undoped epitaxial layer 106 by dry-oxidation at about 900° C., a gate oxide film 8 having a thickness of about 10 nm is formed on the top surface of the undoped epitaxial layer 106 by dry-oxidation, while the p-type channel stop 4 is extended to the undoped epitaxial layer by up-diffusion. Now, boron ions are again implanted at about 50 kev and a dose of about $2 \times 10^{13}$ ions cm$^{-2}$ in the undoped epitaxial layer 106 through the gate oxide film 8, and subsequent annealing of about 900° C., for an activation purpose, forms a buried semiconductor layer 7 (a shaded semiconductor area in the figures) having an impurity profile distributed such that the surface of the well has a peak value of about $2 \times 10^{17}$ atoms cm$^{-2}$ at about 0.08 μm in depth, and also forms a p-type epitaxial layer 6 having a surface impurity concentration of about $10^{16}$ atoms cm$^{-3}$. The buried semiconductor layer 7 has an upper surface 71 and lower surface 72.

Next, a polysilicon gate electrode 9 is formed on the gate oxide film 8 by the conventional processes of CVD and photolithography. Then, a pair of n+ diffusions for source 10S and drain 10D, having a surface impurity concentration of about $10^{20}$ atoms cm$^{-3}$ and junctions of about 0.1 μm in depth, are formed selectively in the surface portion of the p-type epitaxial layer 6 by a conventional self-aligning technique with double ion-implants at 20 kev and a dose of $2 \times 10^{13}$ phosphorous ions (P+) cm$^{-2}$ and at 30 kev and a dose of $4 \times 10^{15}$ arsenic ions (As+)cm$^{-2}$ (See FIG. 2 (b)), followed by an annealing of about 850° C. for an activation purpose, where the above annealing can be replaced by the heat treatment for thermal reflow of boron- or phosphorous-silicate glass (BSG or PSG) film 17 in the subsequent process (See FIG. 2(c)). Thus, an N-channel MOSFET having a channel region 61 of a p-type conductivity, and a pair of source and drain regions of n-type conductivity 10S and 10D is completed by subsequent fabrication steps of patterning aluminum interconnections 19S or 19D in each contact hole 18S or 18D, respectively, and depositing another CVD PSD layer (not shown) for passivation, as shown in FIG. 2(c).

Figure 3A:
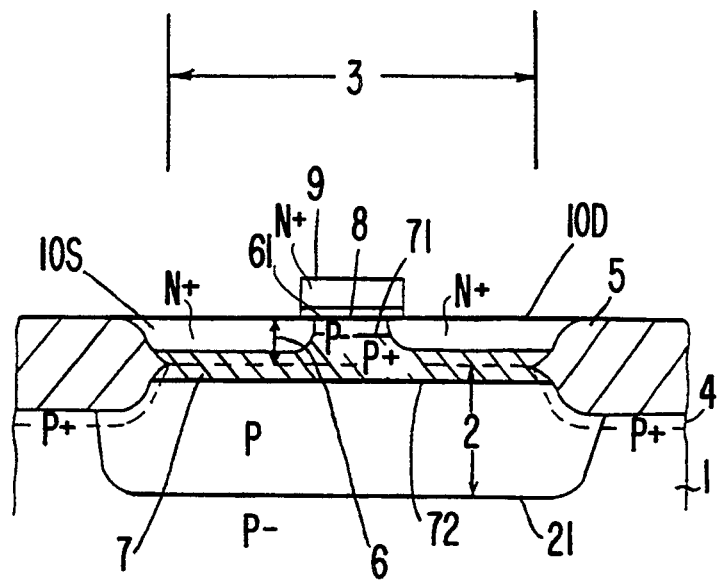
FIG. 3(a) is a cross-sectional view of a portion of the MOSIC related to a second embodiment of the present invention.
Figure 3B:
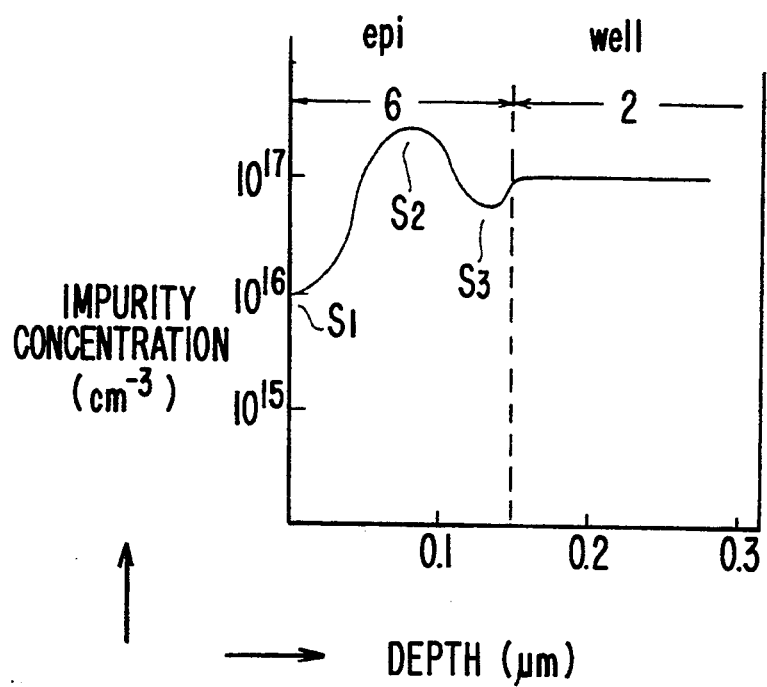
FIG. 3(b) is an impurity profile of a portion below the gate oxide film of the MOSIC related to the second embodiment of the present invention.

FIGS. 3(a) and 3(b) illustrate a basic structure of the MOSFET related to a second embodiment of the present invention. Dimensions and impurity concentration in each portion of the device are essentially the same as those of the MOSFET as shown in FIGS. 2(a) through 2(c). The highly-doped buried semiconductor layer 7 is located roughly in the middle of the undoped epitaxial layer 106 so that lightly-doped portion 6 is left above the upper surface 71 of the highly-doped epitaxial layer 7 for a surface channel region 61. The lightly-doped upper surface portion (indicated by S$_1$) in FIG. 3(b)) provides freedom of selecting the threshold voltage as low as desired, independently of the highly-doped buried semiconductor layer 7. A peak (indicated by S$_2$) is located just across the current path of the punch-through breakdown between source 10S and drain 10D so as to increase the breakdown voltage. Since in most of the embodiments as shown in the cross sectional views, the lower surface 72 of the highly-doped buried semiconductor layer 7 is located within the surface portion 2 of the semiconductor substrate, the final thickness of the well 21 is thinner than the original one indicated by an arrow 2. The lower surface in FIG. 3(b) (indicated by S3) is preferably coincident with the place that the depletion layer of either the source or drain pn-junction is to expand under a reverse bias condition so as to decrease the parasitic capacitance of the pn-junction between either source or drain diffusion and the epitaxial layer underneath. These features, as a whole, contribute to the MOSFET having a further shorter-channel length without deteriorating its driving ability and high speed operation.

Figure 4:
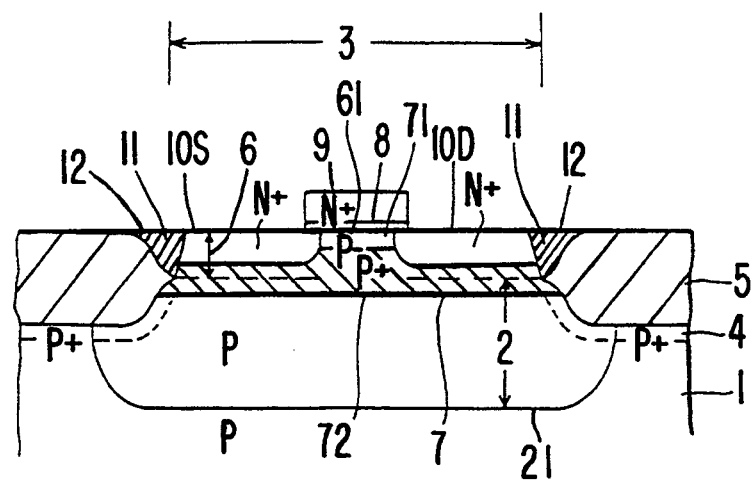
FIG. 4 is a cross-sectional view of a portion of the MOSIC related to a third embodiment of the present invention.

Referring to FIG. 4, reference numeral 11 indicates a groove that might form at the peripheral edge of the selective epitaxial layer under some process condition, and also reference numeral 12 indicates the insulating material such as spin-on-glass (SOG) filled in the groove 12, to avoid the source-to-drain short-circuit and also to planarize the top surface of the device.

Figure 5A:
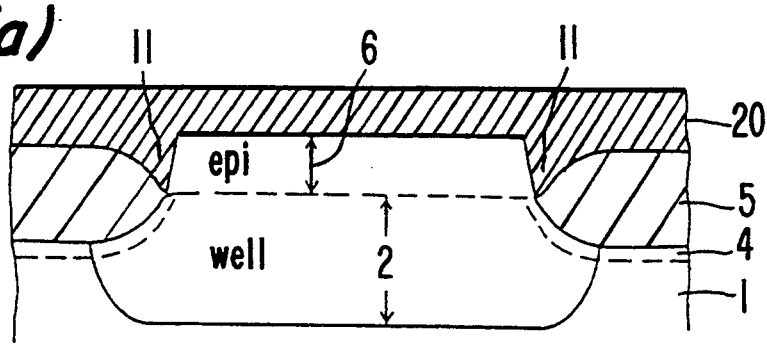
FIGS. 5(a) and 5(b) are cross-sectional views of a portion of an integrated semiconductor device in various steps of the manufacturing process related to a fourth embodiment of the present invention.
Figure 5B:
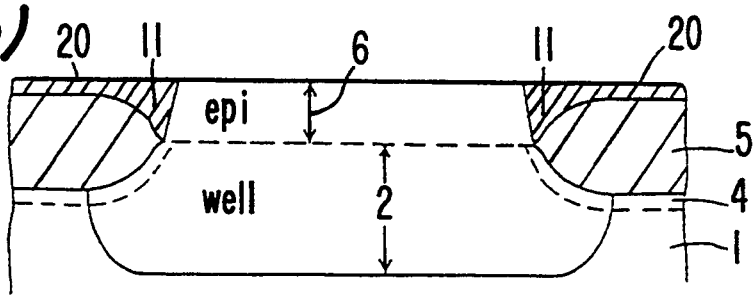

Referring to FIGS. 5(a) and 5(b), in this embodiment, the surface of the epitaxial layer 6 is projected out of that of the field oxide layer 5, and there is a groove 11 at the peripheral edge of the selective epitaxial layer 6. First, an insulating layer 20 such as SOG of about 0.5 μm thick is deposited over the entire surface of the substrate by a multiple spin coating method for planarization, and cured at about 800° C. Next, the insulating layer is etched back by a reactive ion etching process using etching gases such as tetrafluoro-carbon ($CF_4$) and trifluoro-methane ($CHF_3$) until the top surface of the epitaxial layer is exposed, which results in a completely planarized surface having the SOG layer 20 filling the groove 11 and extending over the field oxide layer 5.

Referring to the same FIGS. 5(a) and 5(b), the insulating layer 20 of SOG in FIG. 5(a) can be replaced by a double insulating layer such as a vapor-phase grown PSG (BSG, or BPSG) layer of about 0.3 μm thick and the underlaid SOG of about 0.2 μm thick. This double insulating layer eliminates the difficulty of forming the thick single SOG layer.

Figure 6A:
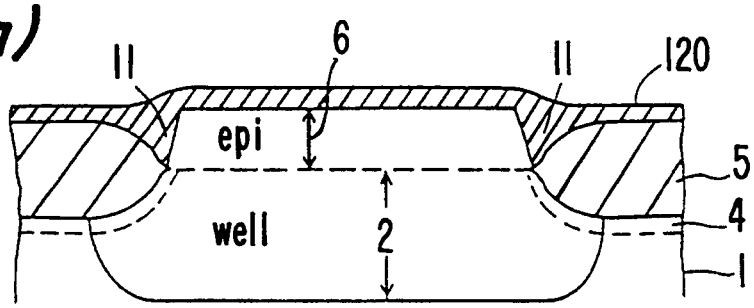
FIGS. 6(a) and 6(b) are cross-sectional views of a portion of the integrated semiconductor device in various steps of the manufacturing process related to a fifth embodiment of the present invention.
Figure 6B:
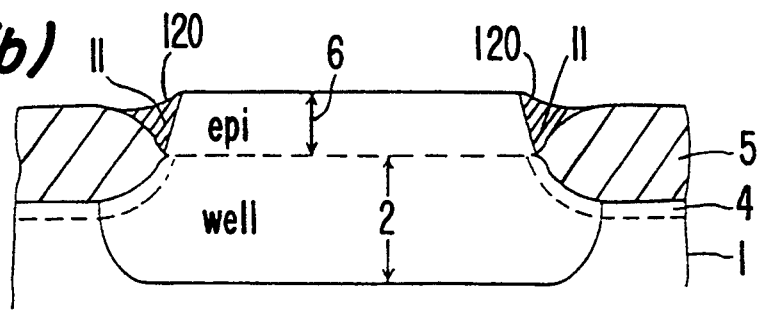

Referring to FIGS. 6(a) and 6(b), this is another embodiment where the surface of the epitaxial layer 6 is also projected out of that of the field oxide layer 5. The insulating layer 120 of SOG is formed by the same method as before except that the SOG is formed to a thickness most appropriate for a spin-coating method, such as 0.2~0.3 μm, and the etchback process leaves the final SOG only in the groove 11.

Figure 7A:
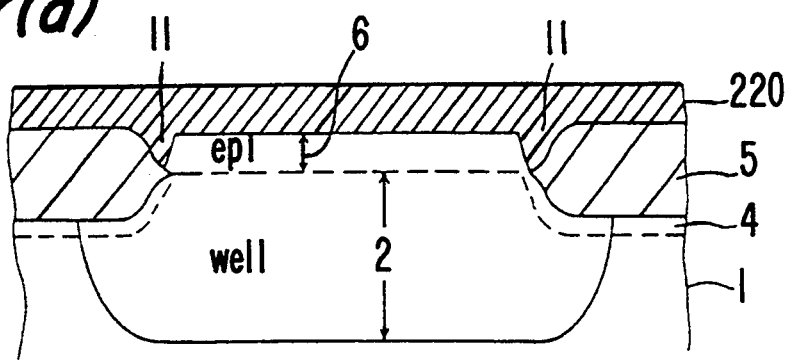
FIGS. 7(a) and 7(b) are cross-sectional views of a portion of the integrated semiconductor device in various steps of the manufacturing process related to a sixth embodiment of the present invention.
Figure 7B:
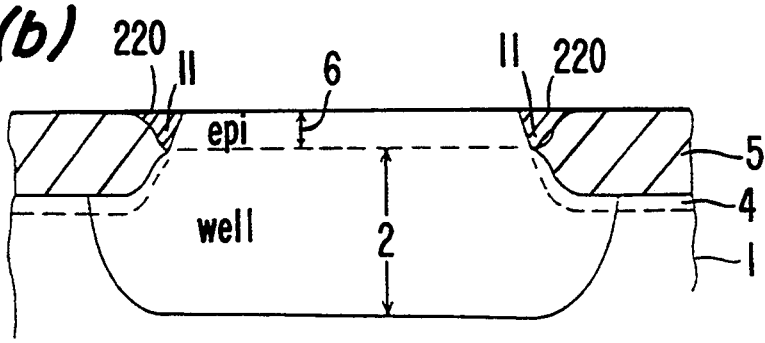

Referring to FIGS. 7(a) and 7(b), this is an embodiment similar to that illustrated in FIG. 5(d) except that the surface of the epitaxial layer 6 is recessed from that of the field oxide layer 5. The thick SOG 220 is formed by the same method as before, and then the SOG 220 and even the underlaid field oxide layer 5 are etched back until the top surface of the epitaxial layer 6 is exposed. This provides a completely flat surface by leaving the SOG layer 220 in the groove 11.

Figure 8:
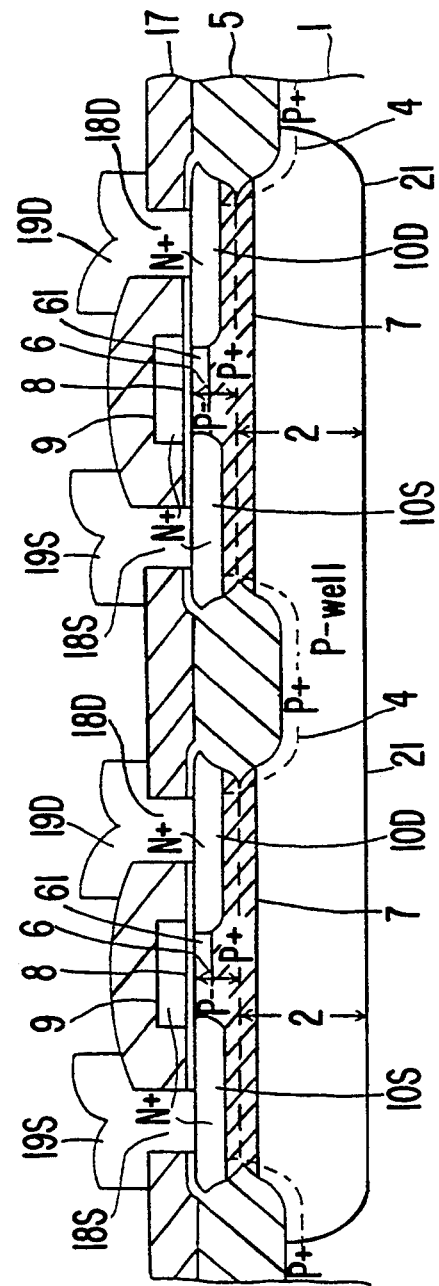
FIG. 8 is a cross-sectional view of a portion of the integrated semiconductor device related to a seventh embodiment of the present invention.

Referring to FIG. 8, two MOSFETs, formed side by side in each selective epitaxial layer 6 are isolated form each other by the field oxide 5 with the channel stop 4, while they share a single well 21 which supplies a common back-gate bias to stabilize their dynamic operations.

Figure 9:
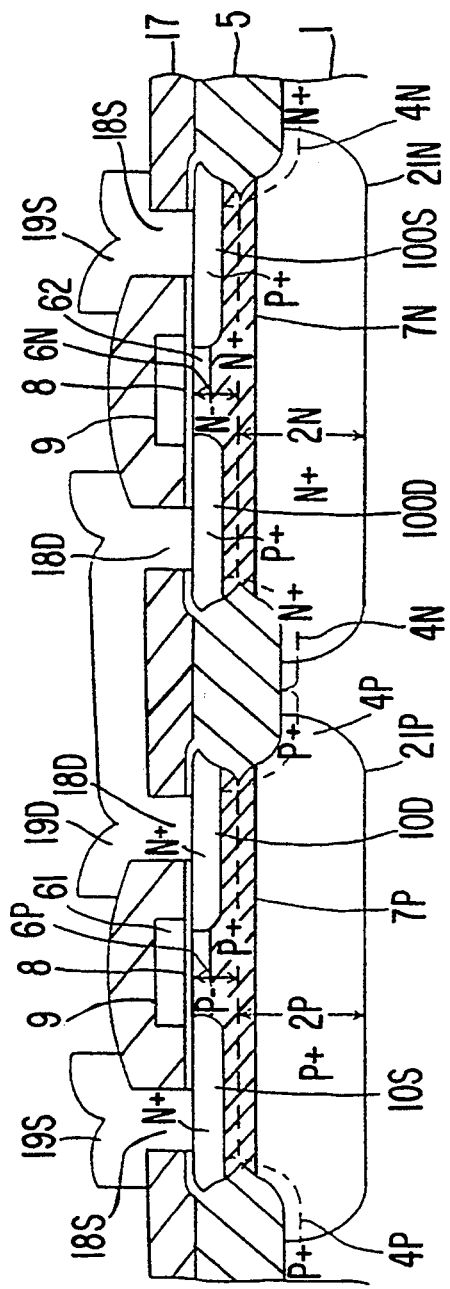
FIG. 9 is a cross-sectional view of a portion of an integrated semiconductor device related to an eighth embodiment of the present invention.

Referring to FIG. 9, reference symbols 2P and 2N, 4P and 4N, and 7P and 7N indicate p- and n-type originally formed wells, p-and n-type channel stops, and p- and n-type buried semiconductor layers, respectively. FIG. 9 illustrates a cross-sectional view of a complementary MOSIC (or CMOSIC) of the present invention. Each of p- and n-type MOSFETs further comprise a lightly-doped epitaxial layer of p- or n-type 6P, 6N, a highly-doped buried semiconductor layer of p- or n-type 7P, 7N, and a highly-doped well of p- or n-type, originally 2P, 2N and finally 21P, 21N, in each of the windows of the field oxide layer, respectively. Each threshold voltage of the p- and n-type MOSFETs is controlled precisely by each ion implant through each of the gate oxide layers 8 to form each of p- and n- channel regions 61, 62, respectively. Each pair of source and drain for p- and n-MOSFETs is denoted by 10S, 10D, and 100S, 100D, respectively. Both drains 10D and 100D are electrically connected by a metal layer 19D, while the source regions 10S and 100S are connected by each of metal layers 19S separately. The surface impurity concentrations of both p- and n-type wells can be chosen to be higher (for instance, $10^{18}$ cm$^{-3}$ or higher) than those of the conventional CMOSICs in which the surface impurity concentrations are usually restricted by each threshold voltage. These features provide CMOSICs having high-packing density and high-immunity to the latch-up effect.

We claim:
1. An integrated semiconductor device comprising:
a semiconductor substrate having a surface and a surface portion bordering the surface, the surface portion having a first conductivity type;
an insulating layer formed on said semiconductor substrate, said insulating layer having a plurality of windows, each window exposing a part of a surface of the surface portion;
a semiconductor layer formed on the exposed parts of the surface of the surface portion, said semiconductor layer further comprising;
a buried semiconductor layer of the first conductivity type having an upper surface in said semiconductor layer;
a first region of the first conductivity type formed above the buried semiconductor layer and adjacent to a surface thereof, the first region of the first conductivity type having an impurity concentration lower than an impurity concentration of the buried semiconductor layer;
a pair of second regions of a second conductivity type opposite to the first conductivity type formed above the buried semiconductor layer and adjacent to the surface thereof, each one of the pair of second regions separated from the other one of the pair of second regions by the first region of the first conductivity type; and
a plurality of active elements formed in said semiconductor layer within selected ones of the windows, each of the active elements further comprising:
the first region of the first conductivity type, and
the pair of second regions of the second conductivity type.

2. The integrated semiconductor device of claim 1, wherein each of selected ones of said plurality of active elements comprises:

an insulated gate field effect transistor having a channel region and source and drain regions;

the channel region comprising the first region of the first conductivity type, and the source and drain regions comprising respective ones of the pair of second regions of the second conductivity type opposite to the first conductivity type.

3. The integrated semiconductor device of claim 1, wherein each of selected ones of said active elements comprises:

an insulated gate film on a top surface of the first region of the first conductivity type; and an insulated gate electrode formed on said insulated gate film across a corresponding one of the windows and extending over a surface of said insulating layer on said semiconductor substrate.

4. The integrated semiconductor device of claim 1, wherein a top surface of said semiconductor layer of the first conductivity type has substantially the same plane as a top surface of said insulating layer.

5. The device of claim 1, wherein the buried semiconductor layer has an impurity profile with a peak value of impurity concentration higher than an impurity concentration of the surface portion of said semiconductor substrate.

6. The integrated semiconductor device of claim 5, wherein the buried semiconductor layer has said impurity profile with said impurity concentration decreasing monotonously from a location of the peak value toward the first region of said semiconductor layer.

7. The integrated semiconductor device of claim 1, wherein the buried semiconductor layer has an impurity profile with the upper surface which is not deeper than a pn junction depth of each one of the pair of second regions.

8. The integrated semiconductor device of claim 1, wherein the buried semiconductor layer has a lower surface which is in said semiconductor layer.

9. The integrated semiconductor device of claim 1, wherein said buried semiconductor layer has a lower surface in the surface portion of said semiconductor substrate.

10. The integrated semiconductor device of claim 1, wherein a pn junction depth of each one of the pair of second regions is shallower than the surface of said semiconductor substrate.

11. The integrated semiconductor device of claim 1, wherein said semiconductor substrate of the first conductivity type is replaced by a semiconductor substrate of a second conductivity type opposite to the first conductivity type.

12. The integrated semiconductor device of claim 1, wherein said device has a groove at a top surface of said semiconductor layer around the window of said insulating layer, the groove filled with an insulating material so that the top surface is planar and smooth.

13. The integrated semiconductor device of claim 2, wherein a plurality of the channel regions of the first conductivity type are formed in a single surface portion of the semiconductor substrate, and each one of the pairs of source and drain regions are isolated from the other one of the pairs by the insulating layer with a channel stop therebetween.

14. An integrated semiconductor device comprising:
a semiconductor substrate of a first conductivity type having a first well of the first conductivity type and a second well of a second conductivity type opposite to the first conductivity type so that the first well is separated from the second well;

an insulating layer on said semiconductor substrate, said insulating layer having a plurality of first and second windows, each of the windows exposing each surface of the first and second wells, respectively;

an epitaxial semiconductor layer selectively formed on each of the exposed surfaces of the first and second wells, each of said epitaxial semiconductor layers having the same conductivity as, and lower impurity concentration than an impurity concentration of each of the underlaid wells;

a plurality of first insulated gate effect transistors selectively formed within the first windows, each of said insulated gate effect transistors having a first insulated gate electrode formed on an insulated gate film across the first window, a first channel region of the first conductivity type and a first pair of source and drain regions of the second conductivity type opposite to the first conductivity type formed in the epitaxial semiconductor layer, so that the first channel region of the first conductivity type is formed between the pair of source and drain regions and under the first insulated gate electrode;

a plurality of second insulated gate effect transistors selectively formed within the second windows, each of the insulated gate effect transistors having a second insulated gate electrode formed on an insulated gate film across the second window, a second channel region of the second conductivity type and a second pair of source and drain regions of the first conductivity type formed in the epitaxial semiconductor layer, so that the second channel region of the second conductivity type is formed between the pair of source and drain regions and under the second insulated gate electrode;

a buried semiconductor layer of the first conductivity type selectively formed in said epitaxial semiconductor layer of the first conductivity type, said buried semiconductor layer of the first conductivity type having a higher impurity concentration than an impurity concentration of the first channel region of the first conductivity type; and a buried semiconductor layer of a second conductivity type selectively formed in said epitaxial semiconductor layer of the second conductivity type, said buried semiconductor layer of the second conductivity type having higher impurity concentration than an impurity concentration of the second channel region of the second conductivity type.

15. An integrated semiconductor device comprising:
a semiconductor substrate having a surface, a first surface portion bordering a part of the surface, and an second surface portion bordering another part of the surface, the first surface portion having a first conductivity type and the second surface portion having a second conductivity type opposite to the first conductivity type;

an insulating layer formed on said semiconductor substrate, said insulating layer having a first window exposing a part of the first surface portion and a second window exposing a part of the second surface portion;

a first semiconductor layer selectively formed on the first surface portion within the first window of said insulating layer, said first semiconductor layer further comprising;

a first buried semiconductor layer of a first conductivity type having an upper surface in said first semiconductor layer, a first region of the first conductivity type adjacent to a surface of said first semiconductor layer and above the first buried semiconductor layer, the first region of the first conductivity type having an impurity concentration lower an than impurity concentration of the first buried semiconductor layer, and a pair of second regions of a second conductivity type opposite to the first conductivity type adjacent to a surface of said first semiconductor layer, each one of the pair of second regions separated from the other one of the pair of second regions by the first region of the first conductivity type, and a second semiconductor layer selectively formed on the second surface portion within the second window of said insulating layer, said second semiconductor layer further comprising;

a second buried semiconductor layer of the second conductivity type having an upper surface in said second semiconductor layer, a third region of the second conductivity type adjacent to a surface of said second semiconductor layer and above said second buried semiconductor layer, the third region of the second conductivity type having an impurity concentration lower than an impurity concentration of the second buried semiconductor layer, and a pair of fourth regions of the first conductivity type adjacent to the surface of said second semiconductor layer, each one of the pair of the fourth regions separated from the other one of the pair of the fourth regions by the third region of the second conductivity type;

a first insulated gate field effect transistor having a first channel region formed in the first region of the first conductivity type and a first pair of source and drain region formed in the pair of second region in said first semiconductor layer; and a second insulted gate field effect transistor having a second channel region formed in the third region of the second conductivity type and a second pair of source and drain region formed in the pair of fourth regions formed in said second semiconductor layer.

* * * * *

UNITED STATES PATENT AND TRADEMARK OFFICE
CERTIFICATE OF CORRECTION

PATENT NO. : 5,362,981
DATED : November 8, 1994
INVENTOR(S) : SATO et al.

It is certified that error appears in the above-indentified patent and that said Letters Patent is hereby corrected as shown below:

Column 5, line 57, change "5(d)" to --5(a)--.

Signed and Sealed this

Fourth Day of July, 1995

Attest:

BRUCE LEHMAN

Attesting Officer    Commissioner of Patents and Trademarks